US009229851B2

(12) United States Patent
Sukegawa et al.

(10) Patent No.: US 9,229,851 B2
(45) Date of Patent: Jan. 5, 2016

(54) MEMORY CONTROLLER, SEMICONDUCTOR MEMORY DEVICE AND CONTROL METHOD THEREOF

(75) Inventors: Hiroshi Sukegawa, Tokyo (JP); Hidetaka Tsuji, Kanagawa (JP); Shuji Takano, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 771 days.

(21) Appl. No.: 12/551,898

(22) Filed: Sep. 1, 2009

(65) Prior Publication Data

US 2010/0217919 A1 Aug. 26, 2010

(30) Foreign Application Priority Data

Feb. 24, 2009 (JP) ................................ 2009-041203

(51) Int. Cl.
*G06F 12/00* (2006.01)
*G06F 13/00* (2006.01)
*G06F 13/28* (2006.01)
*G06F 12/02* (2006.01)
*G11C 16/34* (2006.01)

(52) U.S. Cl.
CPC .......... *G06F 12/0246* (2013.01); *G11C 16/349* (2013.01); *G06F 2212/1032* (2013.01)

(58) Field of Classification Search
CPC ............ G06F 12/0246; G06F 11/1068; G06F 2212/7201; G06F 11/106; G06F 11/1412; G06F 2212/1032
USPC ........................................................ 711/103
See application file for complete search history.

(56) References Cited

U.S. PATENT DOCUMENTS

| 7,039,788 | B1* | 5/2006 | Chang et al. ................... 711/203 |
| 2004/0083335 | A1* | 4/2004 | Gonzalez et al. .............. 711/103 |
| 2007/0263442 | A1* | 11/2007 | Cornwell et al. ........ 365/185.03 |
| 2008/0181018 | A1* | 7/2008 | Nagadomi et al. ....... 365/185.25 |
| 2008/0259708 | A1* | 10/2008 | Tsukazaki et al. ............. 365/222 |
| 2008/0288814 | A1* | 11/2008 | Kitahara ............................ 714/5 |
| 2009/0172267 | A1* | 7/2009 | Oribe et al. .................... 711/103 |

FOREIGN PATENT DOCUMENTS

JP 2004-326867 11/2004
JP 2010-92528 4/2010

OTHER PUBLICATIONS

Korean Office Action corresponding to Korean Patent Application No. 10-2010-0016092.

* cited by examiner

*Primary Examiner* — Charles Rones
*Assistant Examiner* — Sidney Li
(74) *Attorney, Agent, or Firm* — Oblon, McClelland, Maier & Neustadt, L.L.P.

(57) ABSTRACT

A memory controller includes logical-physical address conversion table, an access number storing section configured to store the number of accesses to read out data from a memory cell in association with a logical address, a storage state checking section configured to check a storage state of data stored in the memory cell at every predetermined number of accesses, and a refresh processing section configured to perform refresh processing to restore the data stored in the memory cell if the storage state of the data is in a predetermined degraded state.

20 Claims, 5 Drawing Sheets

MEMORY CONTROLLER, SEMICONDUCTOR MEMORY DEVICE AND CONTROL METHOD THEREOF

CROSS REFERENCE TO RELATED APPLICATION

This application claims the benefit of Japanese Application No. 2009-041203 filed in Japan on Feb. 24, 2009, the contents of which are incorporated herein by this reference.

BACKGROUND OF THE INVENTION

1. Field of the invention

The present invention relates to a memory controller configured to perform control for storing and reading data from a host into and out from a NAND-type flash memory section having a plurality of memory cells, a semiconductor memory device which includes the memory controller, and a control method of the semiconductor memory device.

2. Description of the Related Art

Nonvolatile semiconductor memory devices having a NAND-type flash memory section performs processing to erase data stored in a plurality of memory cells called a block at once, so that a structure of the memory device is simplified and low cost and high capacity are achieved. Further, since semiconductor memory devices have no moving section and their power consumption is low, they have been widely used as storage devices of hosts of portable telephones, portable music players or the like. However, the NAND-type flash memory section has a limit on the number of writes/erasures and the number of readouts.

As for write/erase processing with respect to a memory cell of the NAND-type flash memory section, a limit on the number of writes/erasures is caused because high voltage is applied to a gate on a substrate and an electron is injected into a floating gate. If write/erase processing is executed many times, an oxide film around the floating gate is degraded and data may be destroyed. To prevent write/erase processing from concentrating on a certain memory cell, so-called wear leveling is performed in which a memory controller counts the number of erase processes, replaces a memory cell whose number of erase processing is large with a memory cell whose number of erase processing is small so that the numbers of write/erase processing are averaged.

In a semiconductor memory device which performs the wear leveling, it is difficult for a host to identify a data storage position using a physical address which indicates a physical position of a memory cell in a memory section. To solve this, a concept of logical space is constructed and a physical address is converted to a logical address which indicates a position of a memory cell in the logical space. A logical-physical address conversion table (hereinafter referred to as a "conversion table") is used to convert a logical address to physical address.

On the other hand, the limit on the number of readouts is caused by read disturb. In a case of the NAND-type flash memory section, the read disturb refers to a phenomenon in which electrons are injected gradually into a floating gate because read voltage is applied also to non-selected memory cell from a word line. Therefore, as only readout processing is repeated for readout from a memory cell which stores data, threshold voltage during data readout is changed, that is, a data storage condition is degraded. Accordingly, readout errors are increased, and reliability of read-out data is decreased.

For example, Japanese Patent Application Laid-Open Publication No. 2004-326867 has disclosed that in order to prevent read disturb, rewrite processing is performed on a memory cell whose number of readouts is large as necessary, that is, refresh processing is performed to return threshold voltage in its original state.

In refresh processing in known semiconductor memory devices, a memory cell is identified using a physical address, and thereby the number of readouts is counted and managed. However, since the number of readouts is counted while a logical address is associated with a physical address with respect to memory cells in all area divided into block units, processing is complicated. Furthermore, since a storage section associated with a conversion table in a complicated manner is required, a circuit size is increased.

On the other hand, tolerances of read disturb of a plurality of memory cells in a memory section are very different depending on factors such as manufacturing variations and position in the memory section. To ensure reliability of data to be read out in spite of read disturb, refresh processing needs to be performed at every predetermined number of readings, in which harmful effect does not occur even in a reference memory cell where read disturb is most likely to occur among the plurality of memory cells. However, excessive refresh processing leads to an increase of the number of writes/erasures more than necessary so that the memory cells are degraded, and the reliability of data to be read out may be reduced on the contrary.

BRIEF SUMMARY OF THE INVENTION

One aspect of the present invention provides a memory controller configured to perform control for storing and reading data into and out from a NAND-type flash memory section having a plurality of memory cells, the memory controller including: logical-physical address conversion table configured to perform conversion between a physical address which indicates a position of a memory cell in the NAND-type flash memory section, and a logical address which indicates a position of the memory cell in logical space; an access number storing section configured to store the number of accesses to read out data from the memory cell in association with the logical address; a storage state checking section configured to check a storage state of data stored in the memory cell at every predetermined number of accesses; and a refresh processing section configured to perform refresh processing to restore the data stored in the memory cell if the storage state of the data is in a predetermined degraded state.

Another aspect of the present invention provides a semiconductor memory device configured to store and read out data, the semiconductor memory device including: a NAND-type flash memory section having a plurality of memory cells; logical-physical address conversion table configured to perform conversion between a physical address which indicates a position of a memory cell in the NAND-type flash memory section, and a logical address which indicates a position of the memory cell in logical space; an access number storing section configured to store the number of accesses to read out data from the memory cell in association with the logical address; a storage state checking section configured to check a storage state of data stored in the memory cell at every predetermined number of accesses; and a refresh processing section configured to perform refresh processing to restore the data stored in the memory cell if the storage state of the data is in a predetermined degraded state.

A further aspect of the present invention provides a control method of a semiconductor memory device configured to store and read out data, the control method including: storing the number of accesses for each logical block to which a memory cell belongs, when data is read out from the memory cell which stores the data; checking a storage state of the data stored in the memory cell which belongs to the logical block, at every predetermined number of accesses; and performing refresh processing with respect to the memory cell which belongs to the logical block if the storage state of the data is in a predetermined degraded state.

DETAILED DESCRIPTION OF THE INVENTION

First Embodiment

Hereinafter, a memory controller 10 and a semiconductor memory device 2 of a first embodiment of the present invention will be described with reference to the drawings.

Figure 1:
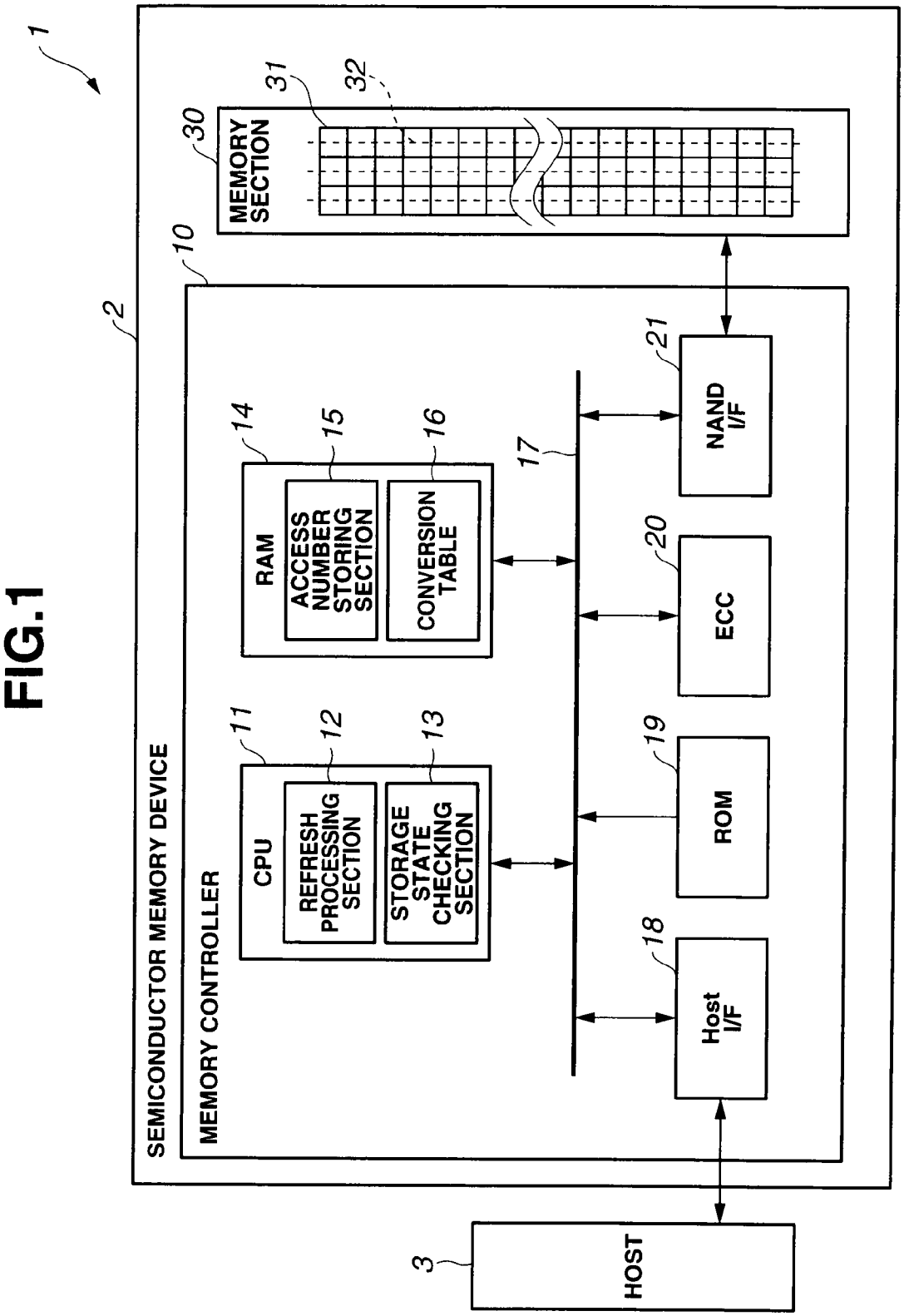
FIG. 1 is a configuration diagram showing a configuration of a semiconductor memory device of a first embodiment.

As shown in FIG. 1, the semiconductor memory device 2 of the present embodiment is a so-called embedded-type storage device or the like which is provided inside a host 3 such as a personal computer or a camera, or in a memory card removably connected to the host 3, and is configured to record startup data and the like of the host 3. Alternatively, the semiconductor memory device 2 and the host 3 may form a memory system 1 of, for example, a portable music player such as an MP3 player. The semiconductor memory device 2 has a semiconductor memory section (hereinafter also referred to simply as a "memory section") 30 and the memory controller 10. The memory section 30 is a nonvolatile NAND-type flash memory section, and has a structure in which a large number of unit cells, memory cells 31, are connected through a bit line (not shown) used for writing, a word line 32 used for readout, and the like.

The memory controller 10 has a ROM 19, a CPU 11 that is a control section, a RAM 14, a host I/F (interface) 18, an Error Correcting Code (ECC) section 20 configured to perform encoding processing of data to be stored and decoding processing of stored data, and a NAND I/F (interface) 21, which are connected to each other via a bus 17.

Being controlled by the CPU 11, the memory controller 10 performs data sending and receiving to and from the host 3 via the host I/F 18 and data sending and receiving to and from the memory section 30 via the NAND I/F 21. During operation of the semiconductor memory device 2, the RAM 14 includes a logical-physical address conversion table 16, and an access number storing section 15 configured to store the number of readouts of data from a memory cell in each logical block, in association with a logical address.

Figure 2:
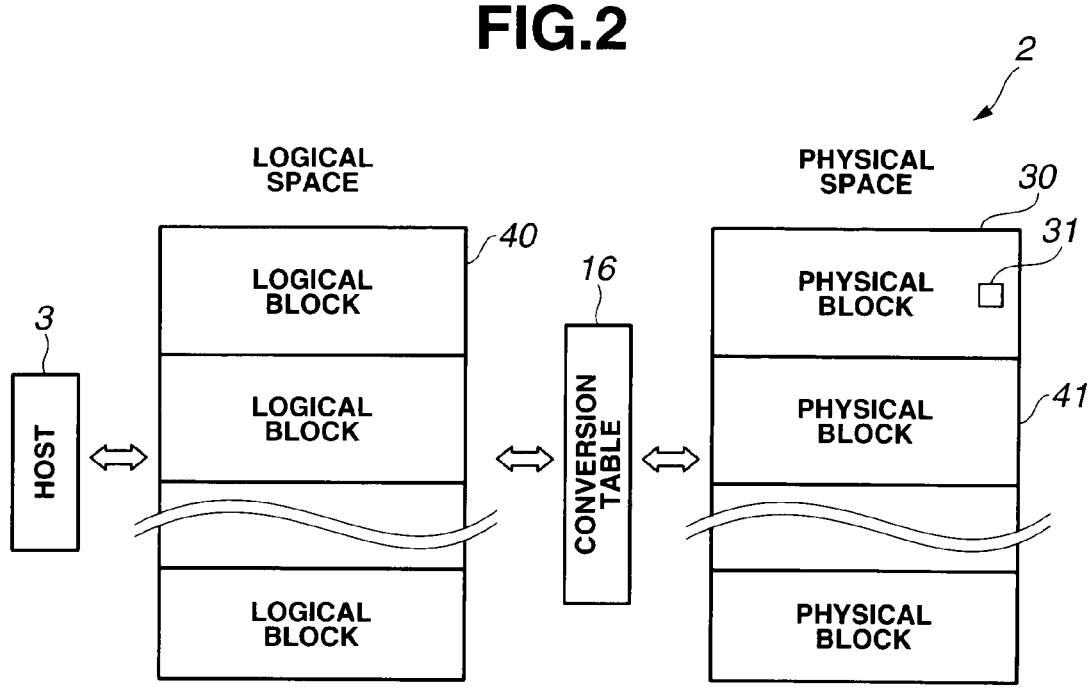
FIG. 2 is an explanatory diagram illustrating relationship between a logical address and physical address in the semiconductor memory device in the first embodiment.

As shown in FIG. 2, a plurality of memory cells 31, which are components of the semiconductor memory section 30, are divided into physical blocks serving as erasure units. On the other hand, the host 3 connected with the semiconductor memory device 2 gives an instruction to send/receive data using a logical address which indicates a position of each memory cell 31 in logical space.

A partition size of the logical space is the same as a physical block size, and a logical-physical address conversion format is provided such that one partition of the logical space (hereinafter referred to as a "logical block 40") is associated with one physical block. Although not shown, the logical-physical address conversion format may be a conversion format in which one logical block is associated with a plurality of physical blocks while a size of one logical block is the same as a size corresponding to plural physical blocks.

By firmware (FW), the CPU 11 executes operations serving as an address conversion section (not shown) configured to perform conversion between a logical address and a physical address based on the conversion table 16, a storage state checking section 13 configured to check a storage state of data stored in each memory cell 31 at every predetermined number of accesses, and a refresh processing section 12 configured to perform refresh processing to restore the data stored in each memory cell 31. Also, the CPU 11 executes overall control of the semiconductor memory device 2 according to a command input from the host 3 by the FW. The ROM 10 is a storage section in which a control program of the semiconductor memory device 2 and the like are stored. Also in some part of the semiconductor memory section 30 or a not shown non-volatile memory section, information for the memory controller 10 to control the semiconductor memory device 2 is stored.

The memory controller 10 of the present embodiment stores the number of accesses for the access number storing section 15 to read out data in logical block units.

Figure 3:
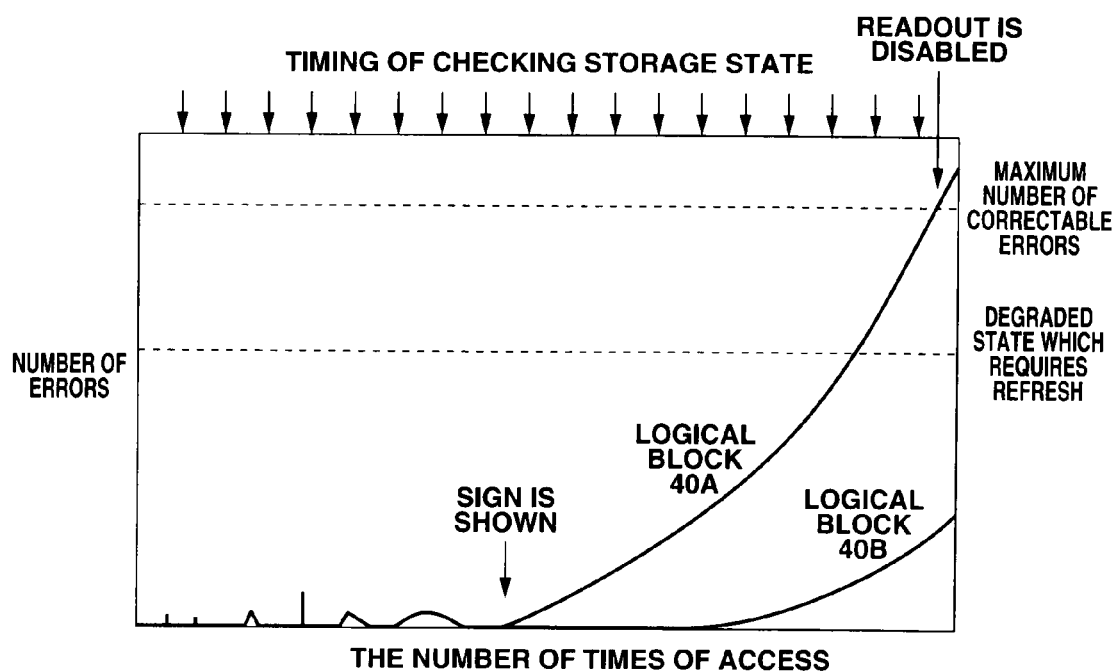
FIG. 3 is an exemplary diagram illustrating relationship between the number of readouts and the number of error occurrences during readout in the semiconductor memory device in the first embodiment.

As shown in FIG. 3, in the semiconductor memory device 2 having the NAND-type flash memory section, after data is stored in a memory cell 31, as the number of data readouts from the same memory cell 31 increases, a storage state of the data is degraded and the number of error occurrences increases. Therefore, for example, one logical block 40A and another logical block 40B are very different in degradation progression rate due to read disturb, that is, in tolerance of read disturb. The number of errors as used herein is the number of errors in decoding processing in the ECC section 20. If the number of errors is smaller than or equal to a maximum number of error corrections of the ECC section 20, error correction is possible, but if the number of errors exceeds the maximum number of error corrections, readout is disabled.

Then, in memory controller 10 of the present embodiment, the storage state checking section 13 checks a storage state of data stored in a memory cell 31 (i.e., the number of errors in decoding processing) in each logical block unit at every predetermined number of accesses for readout. In other words, the storage state checking section 13 checks a storage state of data stored in the memory cell 31 based on the number of errors at a time when encoded data stored in the memory cell 31 is decoded, at every predetermined number of accesses. Although a predetermined number of accesses is to be suitably selected depending on a type, a usage state, and the like of the semiconductor memory device 2, a predetermined number of accesses just needs to be set to have a small enough interval with respect to a difference between the number of accesses at which a sign of read disturb occurs and the number of accesses at which error correction is disabled so that data readout is not allowed. For example, the predetermined number of accesses may be 1 k.

The refresh processing section 12 performs refresh processing to restore data stored in the memory cell 31 only when a storage state of the memory cell 31 becomes a predetermined degraded state, for example, the number of error occurrences becomes eight or more in a case where a maximum number of the error corrections of the ECC section 20 is 12.

A method for the storage state checking section 13 to check a storage state of data stored in a memory cell 31 is not limited to the method of checking the number of error occurrences in decoding processing during normal data readout. For example, a method may be used which checks the number of errors at a setting where a margin of a readout voltage to be applied to the word line 32 during data readout is reduced with respect to a normal readout voltage, which is a setting in which error is more likely to occur. Thus, the storage state checking section 13 may check a storage state of data stored in a memory cell 31 based on a decoding processing result of read-out data under a condition in which an error is more likely to occur than under a condition of normal data readout, at every predetermined number of accesses.

Memory cells 31 whose data storage state are to be checked by the storage state checking section 13 do not have to be memory cells 31 of all data within a target logical block, that is, all the memory cells 31. For example, a memory cell to be checked may only be a memory cell 31 which includes polarity data that tends to cause a read disturb fault, or a memory cell 31 within an area which includes a word line 32 or column address that is less tolerant to read disturb. In other words, based on decoding processing results of data which have been read out from one or more memory cells 31 in which an error is likely to occur among a plurality of memory cells of the NAND-type flash memory section, the storage state checking section 13 may check a storage state of the data stored in the one or more memory cells 31.

When a block is rewritten by processing an update of a correspondence between a logical address and a physical address, a read disturb fault is removed. However, in this case, the access number storing section 15 does not need to reset a stored number of accesses and accumulate counts from zero again. The reason is that the storage state checking section 13 checks a storage state at every predetermined number of times. On the contrary, the number of accesses stored in the access number storing section 15 may be reset to zero each time the storage state checking section 13 checks a storage state. The access number storing section 15 which frequently resets the number of accesses can reduce a capacity of the access number storing section 15.

In addition, the semiconductor memory device 2 of the present embodiment may use a known method for avoiding a read disturb fault together with the above described method. For example, there is a known method which stores data of a block in which the number of readouts is particularly large into the RAM 14 or the like, and reads out the data from the RAM 14 or the like instead of the semiconductor memory section 30 when there is read-in access to a memory cell 31 in the block. Of course, in a case where a read disturb fault avoidance method which transfers data to the RAM 14 or the like as described above is used together, such a logical block is not a target of processing by the access number storing section 15 and the like.

As described in the foregoing, the memory controller 10 of the present embodiment can prevent harmful effect due to excessive refresh processing even if the memory section 30 includes memory cells 31 which are different in degradation progression rate of recording state in a mixed manner. Therefore, reliability of data to be read out is high in the memory controller 10. Further, in the semiconductor memory device 2 and the memory system 1 which have the memory controller 10 of the present embodiment, reliability of data to be read out is high.

Figure 4:
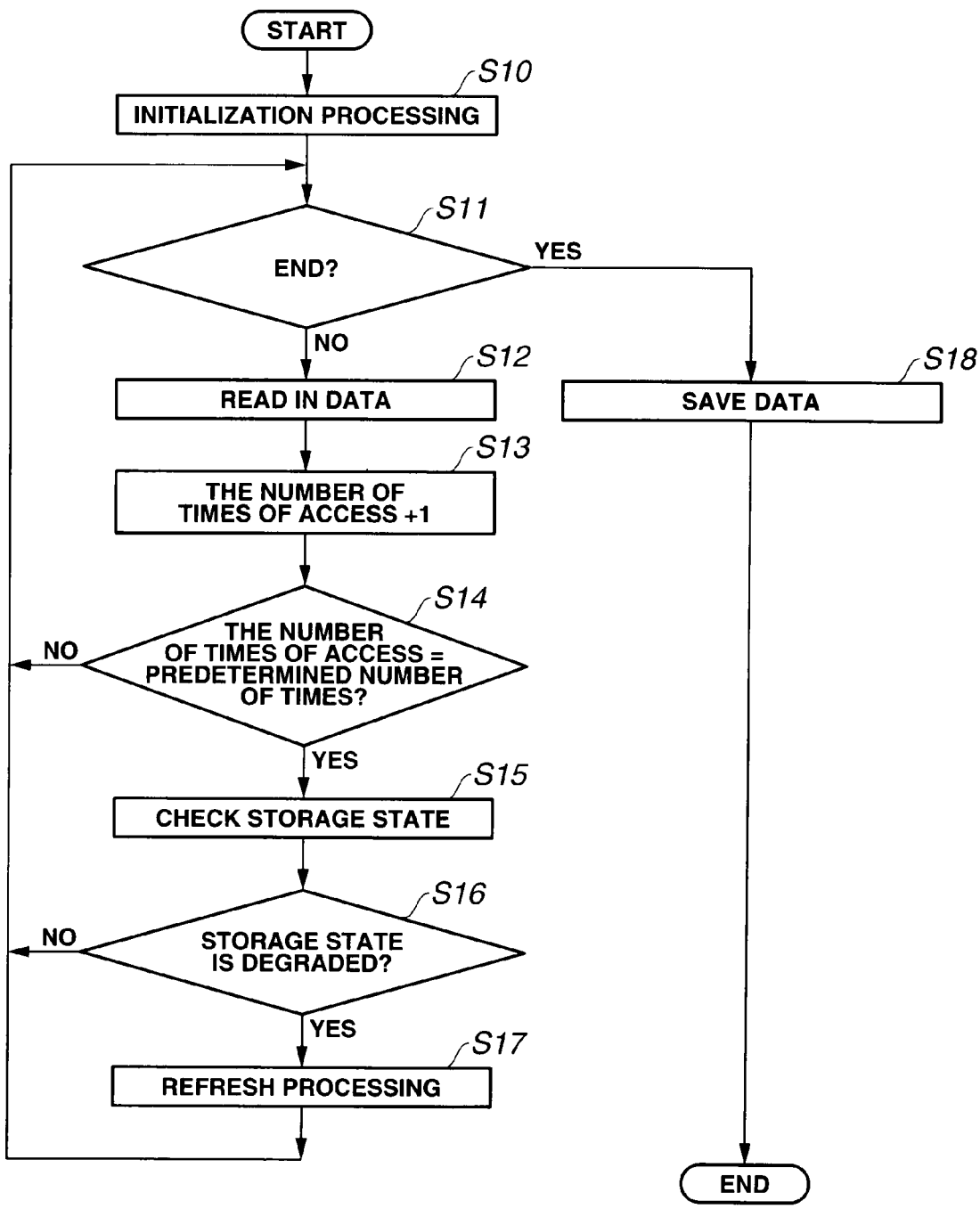
FIG. 4 is a flowchart for describing a flow of processing for preventing read disturb by the memory controller of the first embodiment.

A flow of processing for preventing read disturb by the memory controller 10 of the present embodiment will next be described using a flowchart of FIG. 4.

<Step S10> Initialization Processing

When the semiconductor memory device 2 is powered on, e.g., connected with the host 3, the memory controller 10 transfers information stored in a nonvolatile storage section such as the ROM 19 to the RAM 14 and the CPU 11. Thereby, the CPU 11 has functions as the storage state checking section 13 and the refresh processing section 12. The memory controller 10 may have at least one of the storage state checking section 13 and the refresh processing section 12 which are independent from the CPU 11.

<Step S11> Termination Instruction

The memory controller 10 repeats a predetermined process described below until an instruction to terminate processing is given from the host 3.

<Steps S12, S13> Processing for Storing the Number of Accesses

When an instruction (command) to read out data stored in a memory cell identified based on a logical address is given from the host 3, the memory controller 10 converts the logical address to a physical address based on the conversion table 16, read out data from a memory cell 31 associated with the physical address corresponding to the logical address, applies decoding processing to the read-out data, and outputs the data to the host 3.

The access number storing section 15 adds one to the stored number of accesses when data is read out, that is, a memory cell 31 is accessed to read out the data. The access number storing section 15 stores the number of accesses for each logical block 40 to which an accessed memory cell 31 belongs.

Alternatively, the access number storing section 15 may store (i.e., count) the number of accesses only within a logical block having a large number of accesses, and the storage state checking section 13 and the refresh processing section 12 perform their respective processings only within the logical block whose number of accesses is stored by the access number storing section 15.

<Steps S14, S15, S16> Storage State Checking Processing

The storage state checking section 13 checks a storage state of data stored in a memory cell belonging to the relevant logical block at every predetermined number of accesses. If the storage state is not in a predetermined degraded state, i.e., if the number of error occurrences is less than a predetermined number in decoding processing, the refresh processing section 12 does not perform refresh processing even when the predetermined number of accesses is exceeded.

At least one of the access number storing section 15 and the conversion table 16 may be stored in an internal storage section of the CPU 11 instead of the RAM 14.

<Step S17> Refresh Processing

If the storage state of the data is in the predetermined degraded state, the refresh processing section 12 performs refresh processing. The refresh processing is performed in physical block units by converting logical block information to physical block information using the conversion table 16.

Alternatively, the refresh processing section 12 may perform refresh processing when a data storage state checked by the storage state checking section 13 is in a predetermined degraded state and an instruction to perform refresh processing is given by the host 3. Due to the instruction from the host 3, the memory controller 10 performing refresh processing is in no danger of being powered off during the refresh processing.

Alternatively, refresh processing is not performed immediately when a data storage state checked by the storage state checking section 13 is in a predetermined degraded state, and thereafter the refresh processing section 12 may perform refresh processing during a so-called idling time in which there is no processing instruction from the host 3 for a certain period.

Thus, in the memory controller 10 whose refresh processing section 12 performs refresh processing during an idling time of the connected host 3, a processing speed of read/write processing is not decreased by the refresh processing.

<Step S18> Power-Off Processing (Data Comparison Processing)

When a termination instruction through a command signal such as a "Cache Flush command" is given from the host 3 ahead of power-off, the command signal serves as a trigger, so that the memory controller 10 transfers information of the number of accesses stored in the access number storing section 15 to a nonvolatile storage section.

In a case of the semiconductor memory device 2 which may be powered off without a termination instruction by a command signal or the like from the host 3, it is preferable that the memory controller 10 transfers information of the number of accesses stored in the access number storing section 15 to the nonvolatile storage section at a predetermined time interval or a predetermined second interval of the number of accesses. If the semiconductor memory device 2 is powered off without notice, the information on the number of accesses from the time information of the number of accesses is transferred to the nonvolatile storage section until the power is off is lost as information of the number of accesses. However, this is not a problem if the number of accesses to be lost is so small that it can be ignored with respect to the number of accesses already stored as a statistic in the nonvolatile storage section in terms of characteristics of read disturb fault occurrence. Therefore, the predetermined time interval or the second interval of the number of accesses is set in consideration of characteristics of read disturb fault occurrence.

Thus, the memory controller 10 which transfers information of the number of accesses stored in the access number storing section 15 to a nonvolatile storage section at every predetermined time or every predetermined second number of accesses, can prevent occurrence of read disturb fault even if power is off without notice.

Second Embodiment

Figure 5:
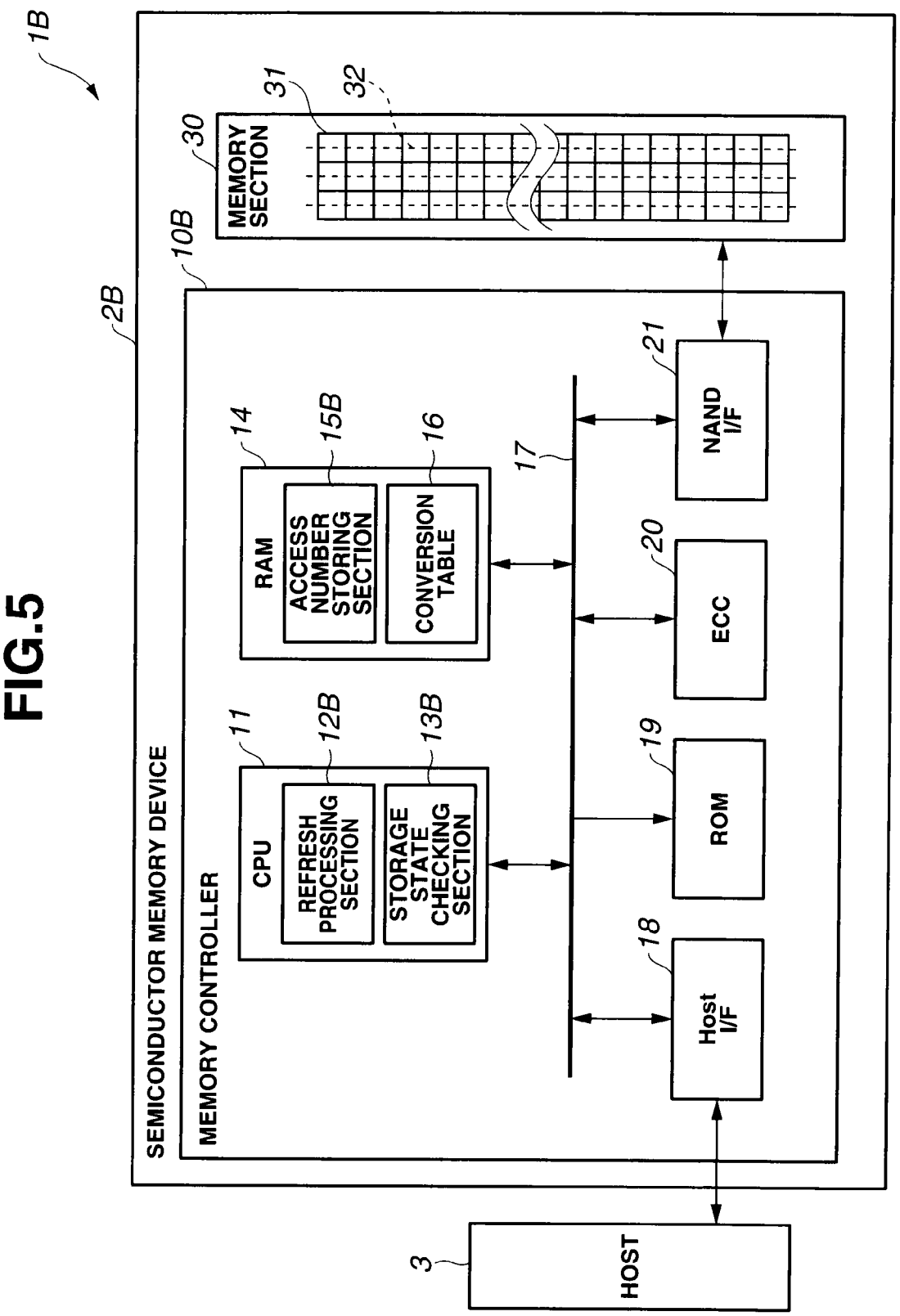
FIG. 5 is a configuration diagram showing a configuration of a semiconductor memory device of a second embodiment.

Next, a memory controller 10B and a semiconductor memory device 2B of a second embodiment of the present invention will be described with reference to FIG. 5 and FIG. 6. Since the memory controller 10B and the semiconductor memory device 2B of the second embodiment are similar to the memory controller 10 and the semiconductor memory device 2 of the first embodiment, the same components are given the same reference numerals, and description thereof will be omitted.

A refresh processing section 12B of the memory controller 10B of the semiconductor memory device 2B performs refresh processing for each physical block unit which is a unit of data erasure composed of a plurality of memory cells 31, and an access number storing section 15B and a storage state checking section 13B performs their respective processings for each logical block group unit which has a plurality of logical blocks each of which has the same size as the physical block unit.

In the memory controller 10 of the first embodiment, the storage state checking section 13 checks a storage state of data stored in a memory cell belonging to such one logical block at every predetermined number of accesses. In contrast, in the memory controller 10B of the present embodiment, the storage state checking section 13B checks a storage state of data stored in a memory cell belonging to such a logical block group at every predetermined number of accesses, and the refresh processing section 12B performs refresh processing only on a physical block whose data storage state is in a predetermined degraded state.

Figure 6:
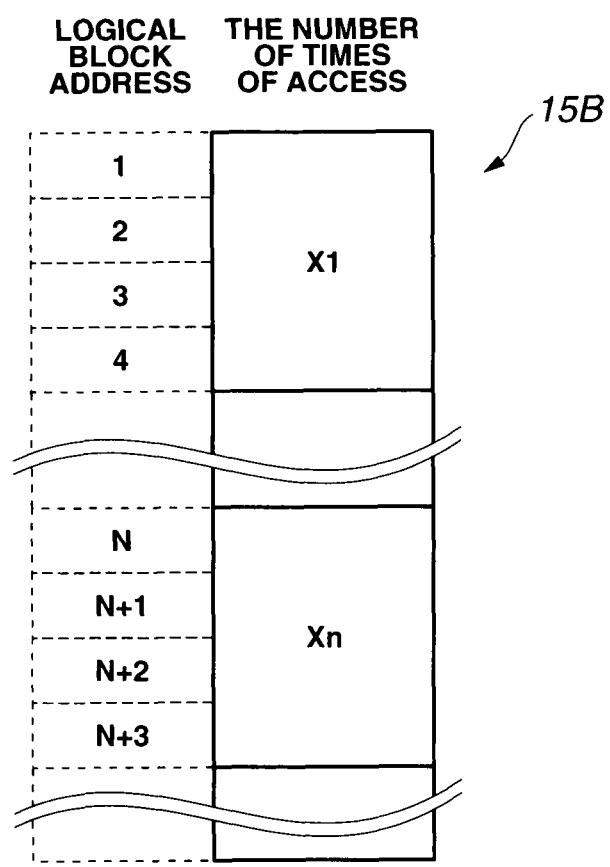
FIG. 6 is an explanatory diagram illustrating a logical block group in the memory controller of the second embodiment.

As shown in FIG. 6, in the memory controller 10B, for example, four continuous logical blocks are defined as one logical block group, and the number of readouts access to each logical block group, referred to as X, is monitored.

For example, in a case where a size of four continuous logical blocks is 4 MB, a capacity of the semiconductor memory section 30 is 4 GB, and each 1 k accesses requires a carry. That is, if 2 bytes are required for counting a predetermined number of times, a capacity of the access number storing section 15B is 2 k bytes. Therefore, when k continuous logical blocks are defined as one logical block group, the capacity of the access number storing section 15B can be reduced to 1/k.

Although a logical block group composed of four logical blocks has been described above as an example, a logical block group just needs to be composed of a plurality of logical blocks. As the number of logical blocks belonging to one logical block group increases, the capacity of the access number storing section 15B can be reduced. However, such increase is not preferable in a case where there is a large number of accesses only to a certain logical block. Preferably, the number of logical blocks belonging to one logical block group is, for example, not less than four but not more than 256.

As described above, the memory controller 10B of the present embodiment has advantages of the memory controller 10 of the first embodiment, and further can reduce the capacity of the access number storing section 15B. In addition, the semiconductor memory device 2B and a memory system 1B which include the memory controller 10B of the present embodiment have advantages of the semiconductor memory device 2 and the memory system 1 of the first embodiment, and further can reduce the capacity of the access number storing section 15B.

Having described the preferred embodiments of the invention referring to the accompanying drawings, it should be understood that the present invention is not limited to those precise embodiments and various changes and modifications thereof could be made by one skilled in the art without departing from the spirit or scope of the invention as defined in the appended claims.

What is claimed is:

1. A memory controller configured to control a flash memory including memory cells, the memory controller comprising:

a memory configured to include an access number storing section configured to store a number of read accesses for encoded data stored in a memory cell in association with one of logical addresses provided from a host apparatus; and a processor configured to include:

an address translator configured to translate the logical addresses to physical addresses of the flash memory;

a storage state checking section configured to, at an interval which is determined by a number of read accesses, check the number of errors in decoding processing of data read from the memory cell; and a refresh processing section configured to perform refresh processing to restore the encoded data stored in the memory cell, when the number of errors checked by the storage state checking section, is larger than a predetermined number, wherein the predetermined number of read accesses is set to have a small enough interval with respect to a difference between a number of accesses at which a sign of read disturb occurs and a number of accesses at which error correction is disabled.

2. The memory controller according to claim 1, wherein:
the refresh processing section performs the refresh processing for each physical block unit having memory cells in a degraded state, the physical block unit being a unit of data erasure composed of a predetermined number of memory cells, the access number storing section stores a number of the read accesses for each logical block unit, and the storage state checking section checks the number of errors in the decoding processing for each logical block unit.

3. The memory controller according to claim 1, wherein:
the refresh processing section performs the refresh processing for each physical block unit having memory cells in a degraded state, the physical block unit being a unit of data erasure composed of a predetermined number of memory cells, the access number storing section stores a number of the read accesses for each logical block group unit which has a plurality of logical blocks, and the storage state checking section checks the number of errors in the decoding processing for each logical block group unit.

4. The memory controller according to claim 3, wherein the refresh processing section performs the refresh processing when an instruction to perform the refresh processing is given from the host apparatus.

5. The memory controller according to claim 3, wherein the storage state checking section checks the storage state of data under a condition in which an error is more likely to occur than a condition of normal data read.

6. The memory controller according to claim 3, wherein the storage state checking section checks the storage state of data stored in a memory cell in which an error is likely to occur.

7. The memory controller according to claim 3, wherein the refresh processing section performs the refresh processing during an idling time of the host apparatus.

8. A semiconductor memory device configured to store and read encoded data, the semiconductor memory device comprising:

a NAND-type flash memory section having memory cells;

a logical-physical address conversion table configured to perform conversion between a physical address which indicates a position of a memory cell in the NAND-type flash memory section, and a logical address which indicates a position of the memory cell in logical space;

an access number storing section configured to store a number of read accesses to read encoded data from a memory cell in association with the logical address;

a storage state checking section configured to, at an interval which is determined by a number of read accesses, check the number of errors in decoding processing of data read from the memory cell; and a refresh processing section configured to perform refresh processing to restore the encoded data stored in the memory cell when the number of errors checked by that the storage state checking section is larger than a predetermined number, wherein the predetermined number of read accesses is set to have a small enough interval with respect to a difference between a number of accesses at which a sign of read disturb occurs and a number of accesses at which error correction is disabled.

9. The semiconductor memory device according to claim 8, wherein:

the refresh processing section performs the refresh processing for each physical block unit having memory cells in a degraded state, the physical block unit being a unit of data erasure composed of a predetermined number of the memory cells, the access number storing section stores a number of the read accesses for each logical block unit, and the storage state checking section checks the number of errors in the decoding processing for each logical block unit.

10. The semiconductor memory device according to claim 8, wherein:

the refresh processing section performs the refresh processing for each physical block unit having memory cells in a degraded state, the physical block unit being a unit of data erasure composed of a predetermined number of the memory cells, the access number storing section stores a number of the read accesses for each logical block group unit which has a plurality of logical blocks, and the storage state checking section checks the number of errors in the decoding processing for the each logical block group unit.

11. The semiconductor memory device according to claim 10, wherein the refresh processing section performs the refresh processing when an instruction to perform the refresh processing is given from a host apparatus.

12. The semiconductor memory device according to claim 10, wherein the storage state checking section checks the storage state of data under a condition in which an error is more likely to occur than a condition of normal data read.

13. The semiconductor memory device according to claim 10, wherein the storage state checking section checks the storage state of data stored in a memory cell in which an error is likely to occur.

14. The semiconductor memory device according to claim 10, wherein the refresh processing section performs the refresh processing during an idling time of a host apparatus.

15. A control method of a semiconductor memory device configured to store and read encoded data, the control method comprising:

storing a number of read accesses for a memory cell, when encoded data is read from the memory cell;

checking a storage state to check the number of errors in decoding processing of data read from the memory cell at an interval which is determined by a predetermined number of read accesses; and performing refresh processing to restore the encoded data stored in the memory cell, when the number of errors in decoding is larger than a predetermined number, wherein the predetermined number of read accesses is set to have a small enough interval with respect to a difference between a number of accesses at which a sign of read disturb occurs and a number of accesses at which error correction is disabled.

16. The control method of the semiconductor memory device according to claim 15, wherein:
the refresh processing is performed for each physical block unit having memory cells in a degraded state, the physical block unit being a unit of data erasure composed of a predetermined number of the memory cells,
a number of read accesses is stored for each logical block unit, and
the checking is performed for each logical block unit.

17. The control method of the semiconductor memory device according to claim 15, wherein;
the refresh processing is performed for each physical block unit having memory cells in a degraded state, the physical block unit being a unit of data erasure composed of a predetermined number of memory cells,
a number of read accesses is stored for each logical block group unit which has logical blocks, and
the storage state checking processing is performed for each logical block group unit.

18. The control method of the semiconductor memory device according to claim 17, wherein
the refresh processing is performed when an instruction to perform the refresh processing is given from a host apparatus.

19. The memory controller according to claim 1, wherein the storage state checking section checks the number of errors during data readout under a voltage condition in which an error is more likely to occur than a condition of normal data read.

20. The memory controller according to claim 8, wherein the storage state checking section checks the number of errors during data readout under a voltage condition in which an error is more likely to occur than a condition of normal data read.

* * * * *